(12) United States Patent
Okubora

(10) Patent No.: US 8,436,699 B2
(45) Date of Patent: May 7, 2013

(54) SEMICONDUCTOR DEVICE AND COMMUNICATION APPARATUS

(75) Inventor: Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 321 days.

(21) Appl. No.: 12/872,544

(22) Filed: Aug. 31, 2010

(65) Prior Publication Data

US 2011/0057748 A1    Mar. 10, 2011

(30) Foreign Application Priority Data

Sep. 10, 2009    (JP) .................................. 2009-208797

(51) Int. Cl.
*H01P 1/203*    (2006.01)

(52) U.S. Cl.
USPC .......................................... 333/205; 333/202

(58) Field of Classification Search ............... 333/202, 333/204, 205, 26; 257/664, 600, 595
See application file for complete search history.

(56) References Cited

U.S. PATENT DOCUMENTS 7,583,168 B2 *    9/2009    Kawai et al. .................. 333/238
2006/0225918 A1    10/2006    Chinda et al.

FOREIGN PATENT DOCUMENTS

JP    2006-295114    10/2006

* cited by examiner

*Primary Examiner* — Stephen Jones
(74) *Attorney, Agent, or Firm* — Dentons US LLP

(57) ABSTRACT

A semiconductor device includes: a transmission line including a capacitor section and an inductor section arranged on a semiconductor substrate, and a junction of the semiconductor substrate and one of the capacitor section and the inductance section, wherein a transmission characteristic of the transmission line is determined by a voltage applied to the junction.

10 Claims, 13 Drawing Sheets

ELECTRODE SIZE 100μm×400μm
Nd=5×10$^{18}$cm-3

SEMICONDUCTOR DEVICE AND COMMUNICATION APPARATUS

BACKGROUND OF THE INVENTION

1. Field of the Invention

The present invention relates to a semiconductor device and a communication apparatus using the semiconductor device.

2. Description of the Related Art

In recent years, in the field of communication and the field of information processing, with the increase in processing speed, the development of a functional element which is smaller, has a wide application band or has excellent energy efficiency is demanded.

In the field of a semiconductor device or a functional element, a material having negative dielectric constant or magnetic permeability was theoretically predicted in 1998, and thereafter, the effect was confirmed in an artificially constructed material, and much attention is suddenly paid to the material from the viewpoint of device application and system application.

At present, a variable beam antenna, a variable filter or the like using a metamaterial of new material or structure is vigorously studied. Here, the metamaterial is an artificially formed left-handed material (substance) having negative dielectric constant or magnetic permeability in electromagnetic and optical properties.

In the propagation of an electromagnetic wave in related art, the propagation direction of an electric field and a magnetic field is represented in a right handed transmission line (RH-TL). On the other hand, the metamaterial is called a left-handed material because the propagation direction is reversed by the effect of the negative dielectric constant and magnetic permeability, and the relation is represented in a left handed transmission line (LH-TL).

As a functional element using the metamaterial, for example, an array antenna (leaky wave antenna) is known in which voltage is applied to liquid crystal formed as a stub inductor, and the phase is controlled so that the beam direction can be manipulated (see, for example, JP-A-2006-211328 (Patent Document 1)).

SUMMARY OF THE INVENTION

In most of the related art functional elements, a structure of using a liquid crystal, ferroelectric substance, magnetic substance or the like is adopted, and a specific manufacturing method is required. Accordingly, they are not suitable for integration with semiconductor devices and other integrated circuit functions in realizing further miniaturization and higher performance. It is desirable that the metamaterial structure to be described here is simply integrated with a semiconductor LSI and its package to the utmost since application to a shield structure is also expected.

On the other hand, in a high-frequency functional element which can be realized using the metamaterial structure, in view of the tendency to multi-band and wide band, when the frequency band is made variable, there is obtained a great merit that one element can deal with many bands. Here, as the high-frequency functional element, a transmission line, a filter, a balun (balanced to unbalanced transformer), an antenna and the like can be enumerated.

From the above, the related art high-frequency functional element of combination of transmission lines using the liquid crystal, ferroelectric substance or the like is not suitable for simple and compact integration with an amplifier of semiconductor such as silicon (Si), a phase detector, a mixer or the like.

Thus, it is desirable to provide a semiconductor device in which a transmission line of left-handed material or right-handed material having a variable transmission characteristic can be constructed on a semiconductor substrate in a simple structure and a communication apparatus using the semiconductor device.

According to an embodiment of the present invention, there is provided a semiconductor device including a transmission line having a capacitor section and an inductor section arranged on a semiconductor substrate, and a junction of the semiconductor substrate and one of the capacitor section and the inductance section, and a transmission characteristic of the transmission line is determined by a voltage applied to the junction.

The semiconductor device can be used for a communication apparatus, especially a communication apparatus for high-speed transmission of 30 GHz or higher.

The transmission line electrically connected to the junction by using the property of semiconductor junction is formed on the semiconductor substrate, so that the left-handed or right-handed transmission line having a variable transmission characteristic can be directly formed on the semiconductor substrate in the simple structure. Here, that the transmission characteristic is determined by the voltage applied to the junction means that the transmission characteristic of the transmission line can be controlled by the voltage.

According to the embodiment of the present invention, the transmission line of left-handed material or right-handed material having the variable transmission characteristic can be formed on the semiconductor substrate in the simple structure.

DESCRIPTION OF PREFERRED EMBODIMENTS

Hereinafter, modes for carrying out the present invention (hereinafter referred to as embodiments) will be described in detail with reference to the drawings. The description will be made in the following sequence.

1. First embodiment (example of a high pass filter)
2. Second embodiment (example of a low pass filter)
3. Third embodiment (example of a band pass filter)
4. Fourth embodiment (example of a balun)
5. Operation and effect of the first to the fourth embodiments
6. Modified example
7. Application example

1. First Embodiment

Figure 1:
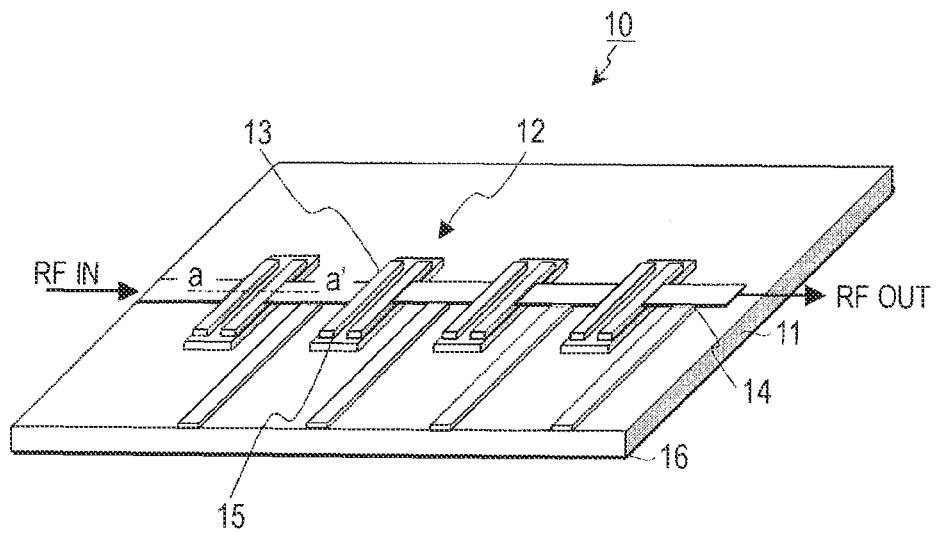
FIG. 1 is a perspective view showing the outline of a structure of a semiconductor device according to a first embodiment of the invention.

FIG. 1 is a perspective view showing the outline of a structure of a semiconductor device according to a first embodiment of the invention. A semiconductor device 10 according to the first embodiment has a structure having a so-called left-handed transmission line 12 of a metamaterial structure formed on a semiconductor substrate 11, such as a silicon substrate, on which an active component or circuit, such as a MOS transistor or a bipolar transistor, can be formed. The transmission line 12 is, for example, a microstrip transmission line to transmit an electromagnetic wave.

Figure 2:
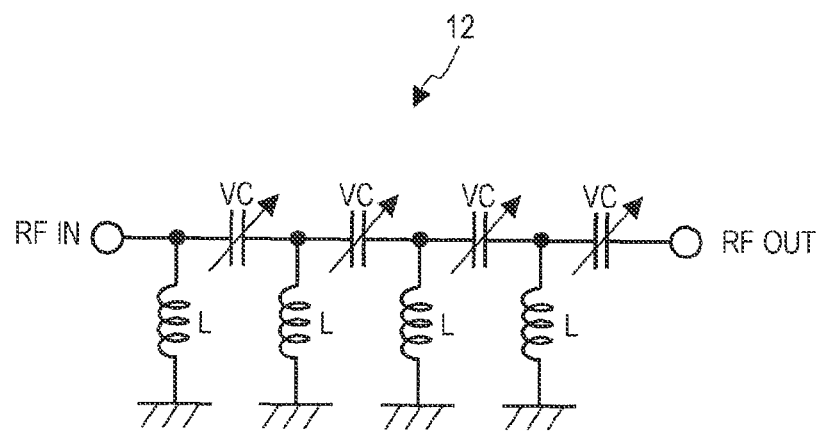
FIG. 2 is a view showing an equivalent circuit of the semiconductor device according to the first embodiment.

The transmission line 12 includes a capacitor section 13, an inductor section 14 and an MSM (Metal-Semiconductor-Metal) junction 15. When a desired signal RF is inputted to the left end in the drawing, the transmission line 12 transmits the signal RF from the left to the right, and outputs it from the right end. As shown in FIG. 2, the equivalent circuit of the transmission line 12 is represented by an inductance L and a variable capacitance VC. The transmission line 12 has a structure generically called the left-handed transmission line.

Figure 3:
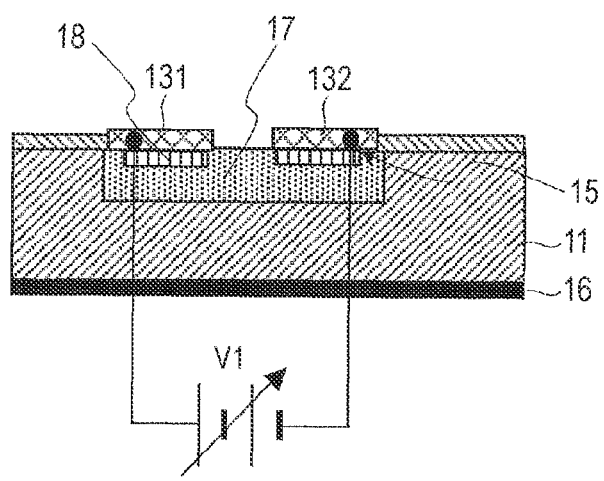
FIG. 3 is a sectional view showing a sectional structure along line a-a' of FIG. 1.

FIG. 3 is a sectional structure along line a-a' of FIG. 1. The semiconductor substrate 11 is used as a dielectric substance. Thus, the semiconductor substrate 11 is a high resistance substrate (Si (Semi-insulating) substrate) doped with Fe or the like. A ground surface 16 is formed on the back surface of the semiconductor substrate 11. An $N^-$ or $P^-$ region 17 is formed in a surface portion of the semiconductor substrate 11 so as to extend over two electrodes 131 and 132 forming the capacitor section 13.

By forming the $N^-$ or $P^-$ region 17 to extend over the two electrodes 131 and 132 forming the capacitor section 13 as stated above, a depletion layers 18 based on a metal Schottky junction is formed just below each of both the electrodes 131 and 132. By this, an MSM junction 15 is formed just below the formation portion of the capacitor section 13.

In the MSM junction 15, a voltage V1 is applied between the electrodes 131 and 132 from the outside, and the width of the depletion layer 18 is changed by the voltage value of the voltage V1, so that the capacitance component of the capacitor section 13 can be changed. As a result, the capacitance value of the transmission line 12 can be made variable according to the voltage value of the voltage V1.

Figure 4:
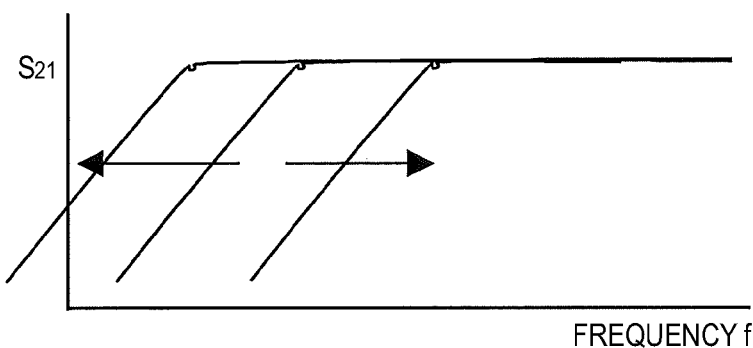
FIG. 4 is a characteristic view showing an energy transmission efficiency (S parameter) with respect to a frequency f when voltage V1 is changed.

The transmission line 12 of the embodiment as constructed above is the left-handed transmission line having the equivalent circuit shown in FIG. 2. The propagation constant of the transmission line 12 and the impedance characteristic easily become variable characteristics according to the voltage V1 applied from the outside to the junction capacitance section shown in FIG. 1, that is, the MSM junction 15. In other words, the transmission line 12 has the propagation constant and the impedance characteristic which can be changed according to the voltage V1. FIG. 4 shows an energy transmission efficiency (so-called S parameter S21) with respect to a frequency f when the voltage V1 is changed.

Besides, the transmission line 12 of the embodiment can be directly formed on the semiconductor substrate 11 such as a silicon substrate. Accordingly, the transmission line can be easily integrated with an active element or circuit such as a MOS transistor or a bipolar transistor.

Figure 5:
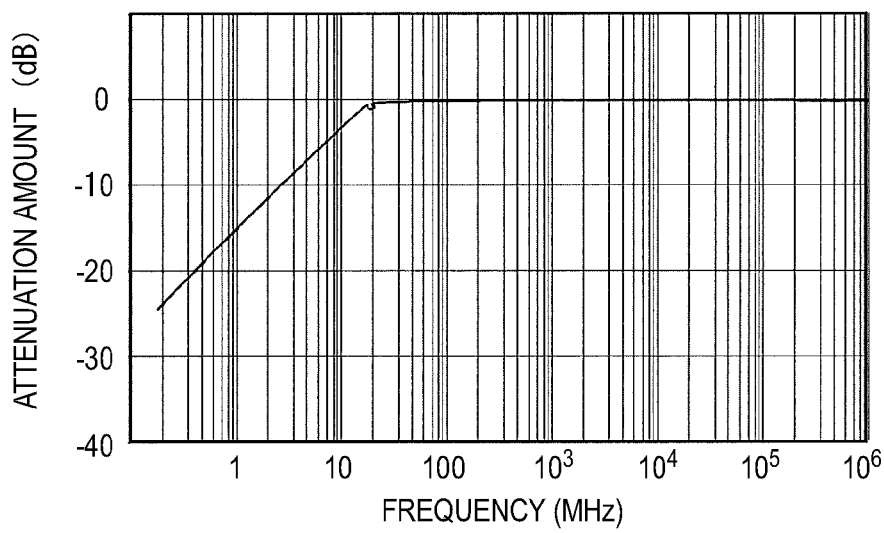
FIG. 5 is a view showing an example of a frequency characteristic of a high pass filter based on an equivalent circuit of a left-handed transmission line.

FIG. 5 shows a calculation example of frequency characteristic based on the equivalent circuit (see FIG. 2) of the left-handed transmission line 12 formed on the semiconductor substrate 11, such as the silicon substrate, as described above. As is apparent from the frequency characteristic, the left-handed transmission line 12 has basically the characteristic of a high pass filter. The propagation constant of the left-handed transmission line 12 can be controlled by the voltage V1 applied from the outside. Accordingly, the cut-off frequency of the high pass filter can be made variable according to the voltage V1, and the high pass filter for all bands can be constructed.

Modified Example of the First Embodiment

Although the capacitance component of the transmission line 12 is made variable in this embodiment, the inductance component can be made variable.

Figure 6:
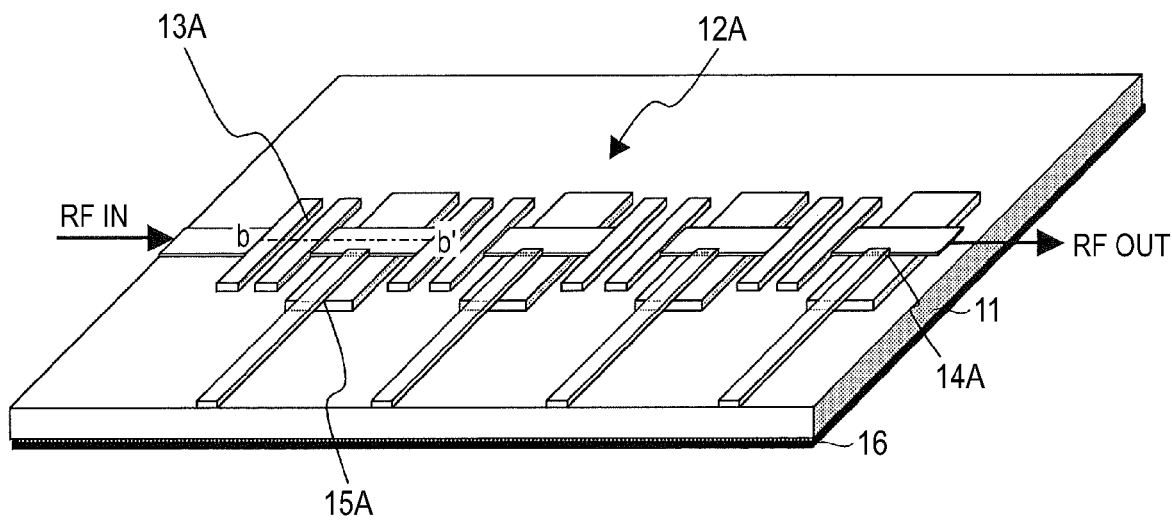
FIG. 6 is a perspective view showing the outline of a structure of a transmission line according to a modified example of the first embodiment.

FIG. 6 is a perspective view showing a schematic structure of a transmission line according to a modified example of the first embodiment. In FIG. 6, the same portion (corresponding portion) as that of FIG. 1 is denoted by the same reference numeral and its duplicate description is omitted.

Figure 7:
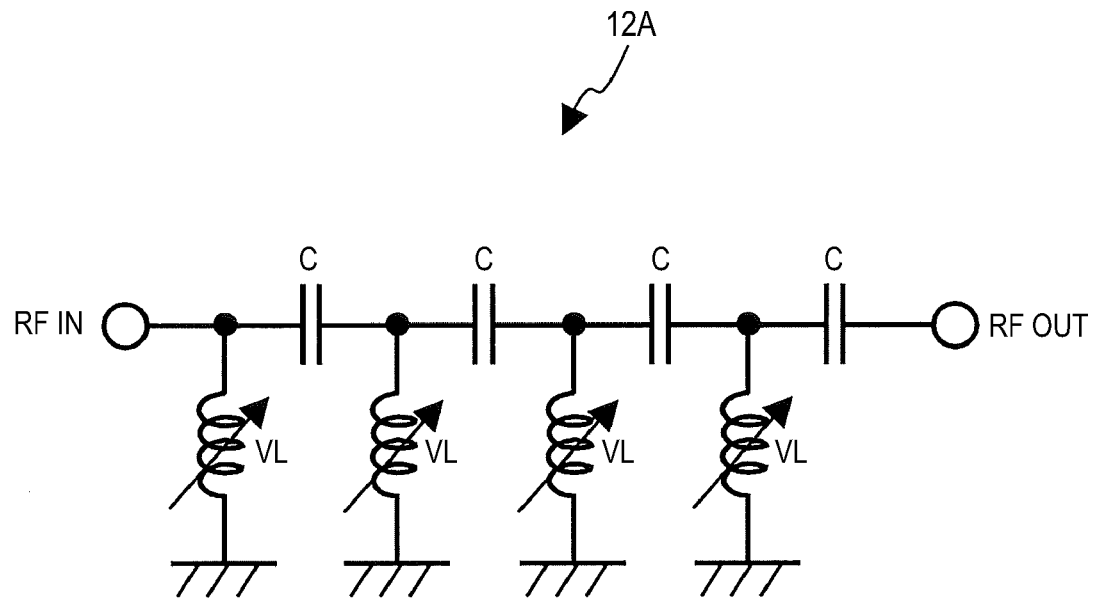
FIG. 7 is a view showing an equivalent circuit of the transmission line according to the modified example of the first embodiment.

A transmission line 12A of the modified example is formed on a semiconductor substrate 11 such as a silicon substrate, and includes a capacitor section 13A, an inductor section 14A and an MSM junction 15A. When a desired signal RF is inputted to the left end in the drawing, the transmission line 12A transmits the signal RF from the left to the right, and outputs it from the right end. As shown in FIG. 7, an equivalent circuit of the transmission line 12A is represented by a variable inductance VL and a capacitance C.

Figure 8:
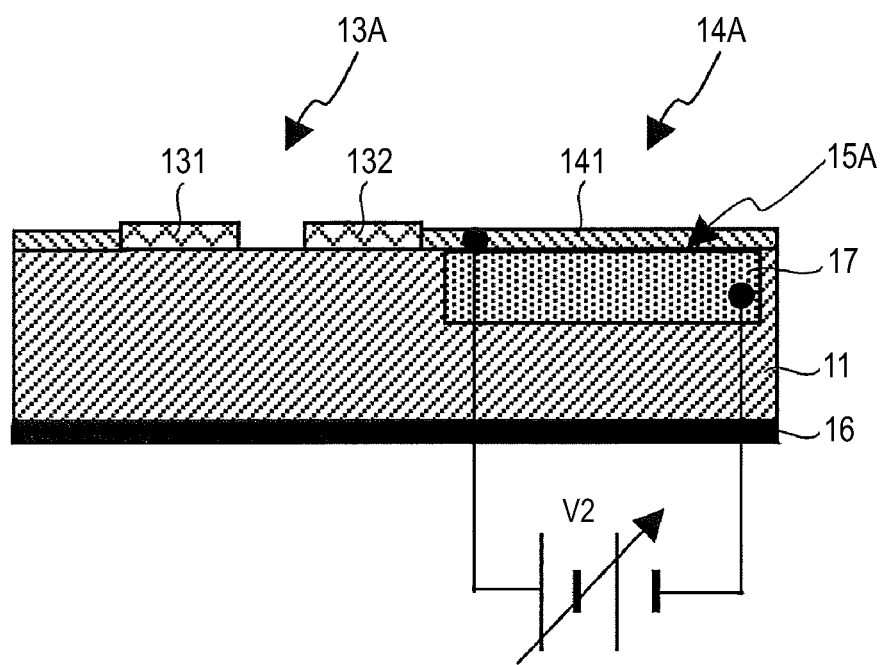
FIG. 8 is a sectional view showing a sectional structure along line b-b' of FIG. 5.

FIG. 8 shows a sectional structure along line b-b' of FIG. 6. The capacitor section 13A includes two electrodes 131 and 132, and a capacitance is formed between the electrodes 131 and 132. An N⁻ or P⁻ region 17 is formed just below a portion constituting the inductance component of the inductor section 14A. By this, the MSM junction 15A is formed just below the formation portion of the inductor section 14A.

Besides, a contact section (not shown) is formed in the N⁻ or P⁻ region 17, and can be electrically connected from the outside through the contact section. When a voltage V2 is applied to the N⁻ or P⁻ region 17 and a conductor 141 just above the region, the inductance value of the inductance section 14A can be made variable by the voltage value of the voltage V2.

In the first embodiment and its modified example, with respect to an impurity (dopant) of the N⁻ or P⁻ region 17 required for forming the MSM junction 15, 15A, it can be easily formed using a well-known diffusion method or an ion implantation method.

Besides, in the first embodiment and its modified example, although the description is made while using the MSN junction as an example, the invention is not limited to the MSM junction. For example, it is needless to say that the so-called P-N junction may be used, and a structure in which a capacitance value or an inductance value can be changed can be realized.

2. Second Embodiment

In the first embodiment, the transmission line having the structure called the left handed transmission line is used as an example. A transmission line called a right handed transmission line corresponding thereto can also be constructed in the same principle. The right-handed transmission line will be described below as the second embodiment.

Figure 9:
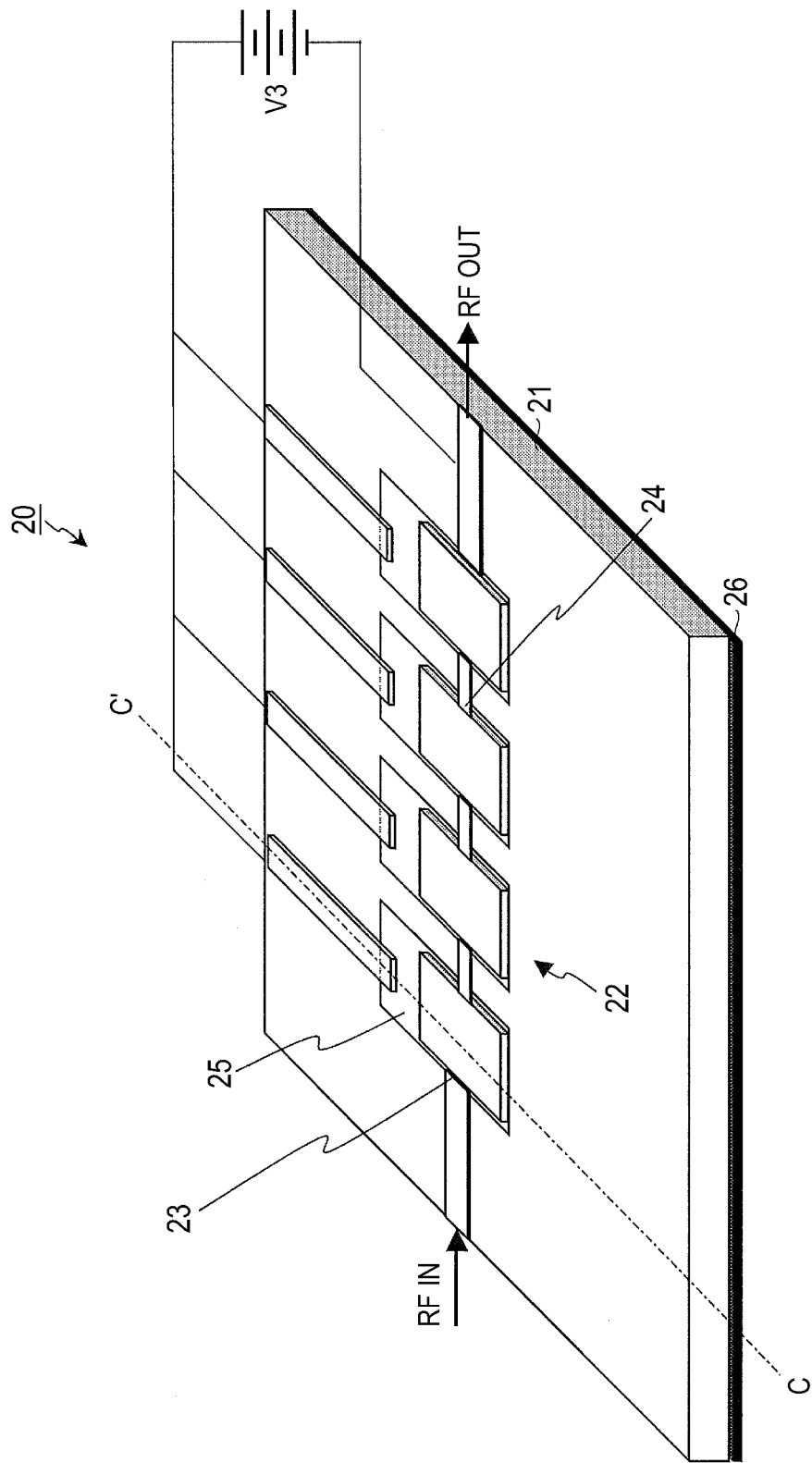
FIG. 9 is a perspective view showing the outline of a structure of a semiconductor device according to a second embodiment of the invention.

FIG. 9 is a perspective view showing the outline of a structure of a semiconductor device according to the second embodiment. A semiconductor device 20 of this embodiment has a structure in which a right-handed transmission line 22 is formed on a semiconductor substrate 21 such as a silicon substrate in which an active element or circuit such as a MOS transistor or a bipolar transistor can be formed. The transmission line 22 is, for example, a macro strip transmission line to transmit an electromagnetic wave.

Figure 10:
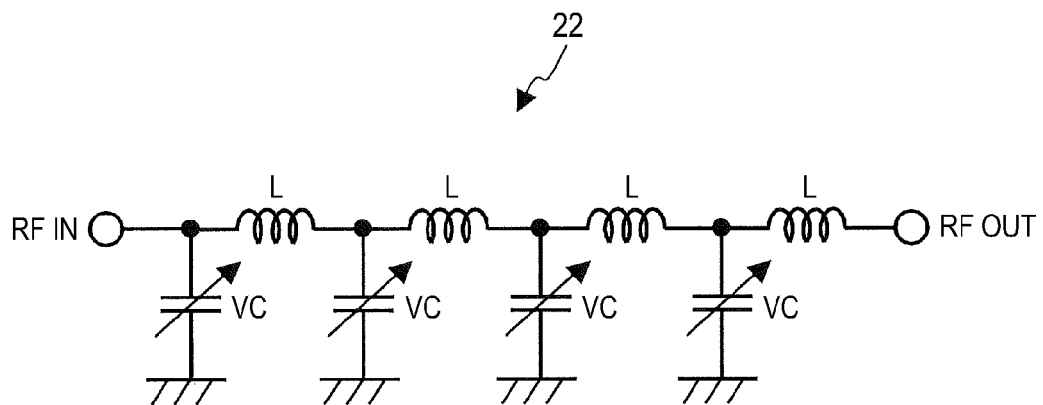
FIG. 10 is a view showing an equivalent circuit of the semiconductor device according to the second embodiment.

The transmission line 22 has a structure in which a capacitor section 23 and an inductor section 24 are alternately formed in series. When a desired signal RF is inputted to the left end in the drawing, the transmission line 22 transmits the signal from the left to the right, and outputs it from the right end. As shown in FIG. 10, an equivalent circuit of the transmission line 22 at this time is represented by an inductance L and a variable capacitance VC. The transmission line 22 has a structure called a right-handed transmission line.

Figure 11:
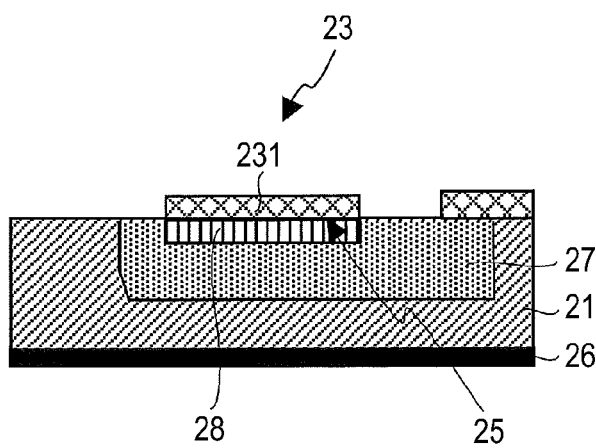
FIG. 11 is a sectional view showing a sectional structure along line c-c' of FIG. 8.

FIG. 11 shows a sectional structure along line c-c' of FIG. 9. Similarly to the case of the first embodiment, aground surface 26 is formed on the back surface of the semiconductor substrate 21. An N or P region 27 is formed in the surface portion of the semiconductor substrate 21, so that a depletion layer 28 is formed just below a conductor 231 of the capacitor section 23. By this, an MS junction 25 is formed just below the formation portion of the capacitor section 23. A voltage V3 is applied to the MS junction 25 from the outside, so that the capacitance component of the capacitor section 23 can be made variable by the voltage value of the voltage V3.

(Junction Capacitance by MS Junction)

The junction capacitance C by MS junction is given by following expression (1) from the property of Schottky junction.

$$C = S \times \varepsilon 0 \times \varepsilon s / d \qquad (1)$$
$$= S \times (e \times \varepsilon 0 \times \varepsilon s / 2 \times (Vd + V))^{1/2}$$

Here, S denotes an area of the junction, e denotes an electron elementary charge, ∈0 denotes a material dielectric constant in vacuum, ∈s denotes a relative dielectric constant, d denotes a junction depletion layer thickness, Vd denotes a junction diffusion potential, and V denotes an applied voltage.

Figure 12:
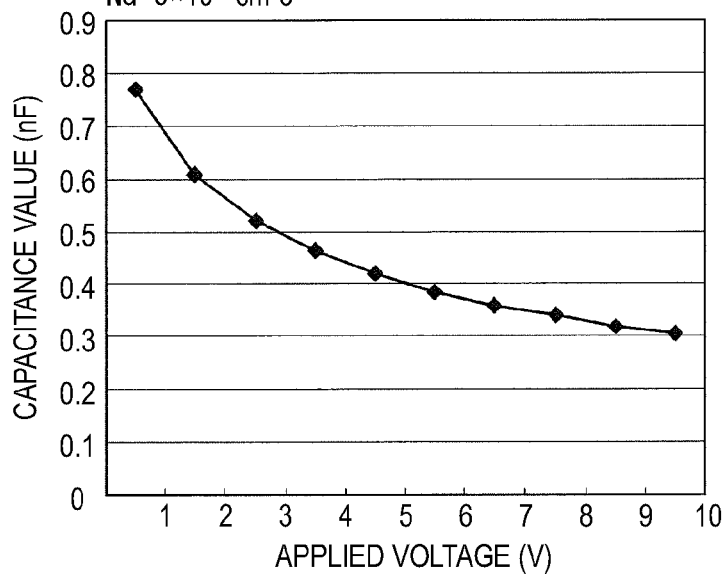
FIG. 12 is a characteristic view showing an example of C-V characteristic representing a state of change in depletion layer capacitance C when an applied voltage V is changed.

As is apparent from the expression (1), the junction capacitance C is proportional to the square root of the applied voltage V. For example, when the electrode size is 100 μm×400 μm, the donor density Nd is 5×10¹⁸ (cm⁻³) and V is −Vd, it can be estimated that the junction capacitance C is about 680 [pF] at maximum. FIG. 12 shows an example of C-V characteristic in this case. The C-V characteristic represents the change of the depletion layer capacitance (junction capacitance) C when the applied voltage V is changed.

The transmission line 22 of this embodiment constructed as stated above is the right-handed transmission line having the equivalent circuit shown in FIG. 10. The propagation constant of the transmission line 22 and the impedance characteristic are characteristics which can be easily changed according to the voltage V3 applied from the outside to the junction capacitance section shown in FIG. 9, that is, the MS junction 25. In other words, the transmission line 22 has the propagation constant and the impedance characteristic which can be changed according to the voltage V3.

Figure 13:
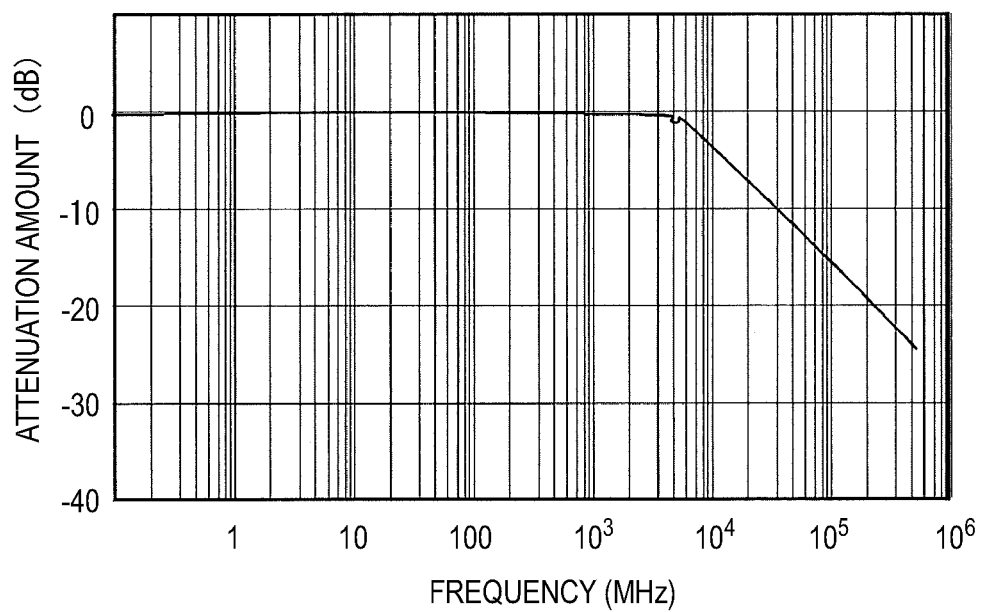
FIG. 13 is a view showing an example of frequency characteristic of a low pass filter based on an equivalent circuit of a right-handed transmission line.

FIG. 13 shows a calculation example of a frequency characteristic based on the equivalent circuit (see FIG. 10) of the right-handed transmission line 22 formed on the semiconductor substrate 21 such as the silicon substrate. As is apparent from the frequency characteristic, the right-handed transmission line 22 basically has the characteristic of a low pass filter. The propagation constant of the right-handed transmission line 22 can be controlled by the voltage V3 applied from the outside. Accordingly, the cut-off frequency of the low pass filter can be changed according to the voltage V3, and the low pass filter for all bands can be constructed.

Modified Example of the Second Embodiment

Although the capacitance component of the transmission line 22 is variable in this embodiment, the inductance component can be made variable.

Figure 14:
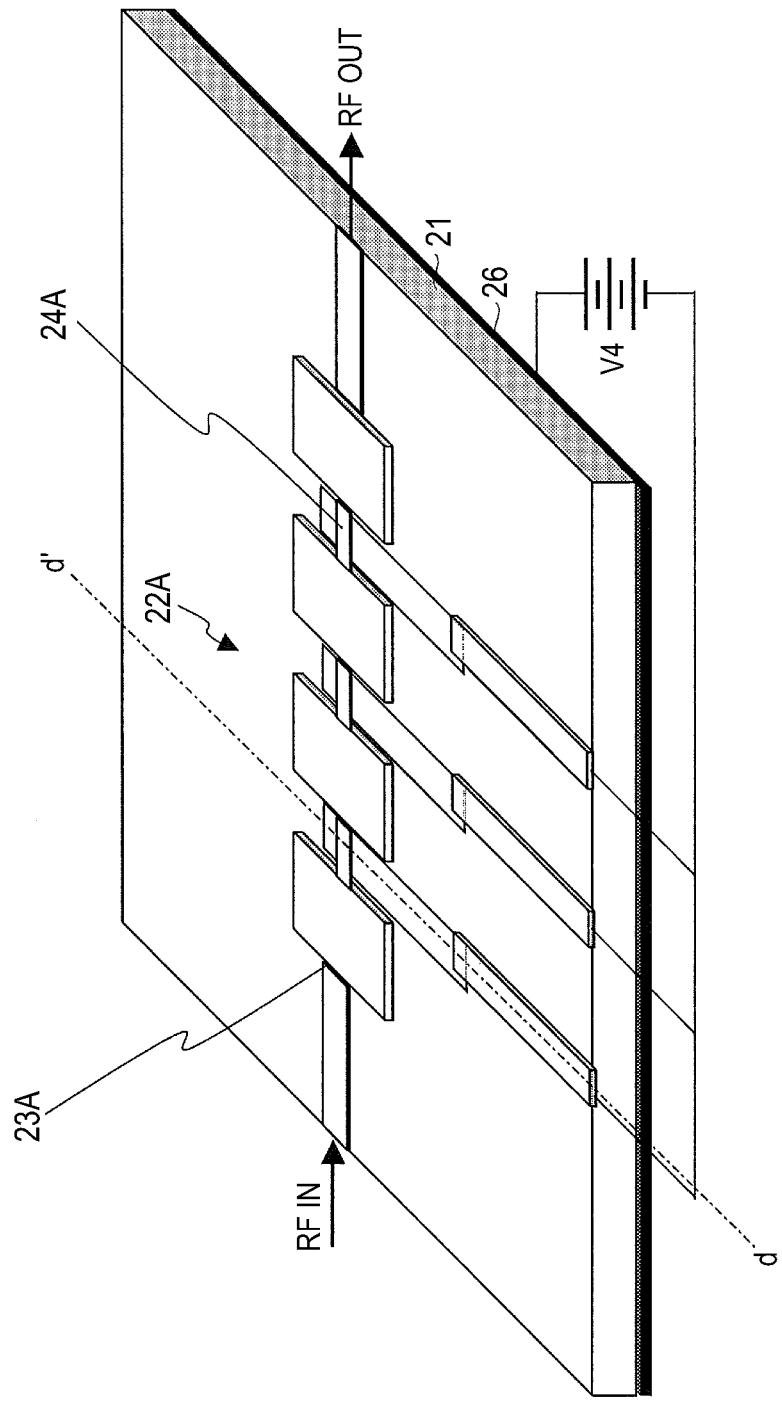
FIG. 14 is a perspective view showing the outline of a structure of a transmission line according to a modified example of the second embodiment.

FIG. 14 is a perspective view showing a schematic structure of a transmission line according to a modified example of the second embodiment. In FIG. 14, the same portion as that of FIG. 9 is denoted by the same reference numeral and its duplicate description is omitted.

Figure 15:
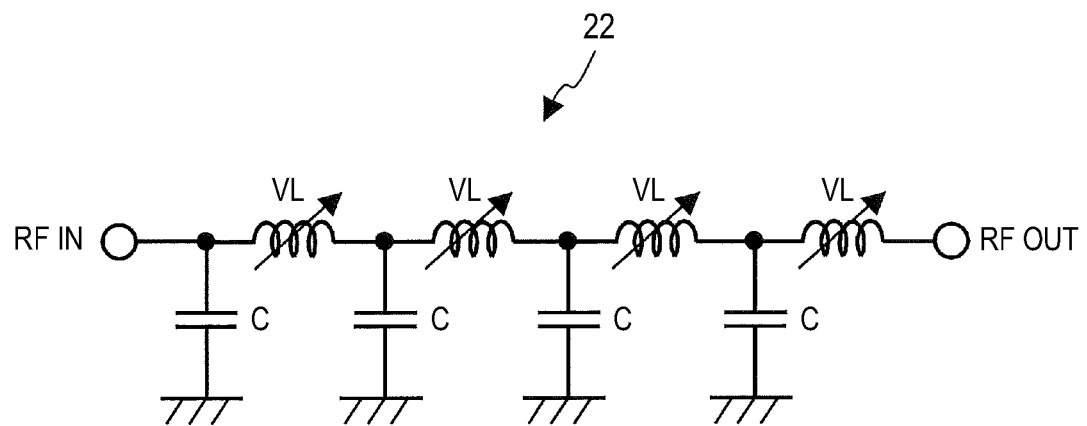
FIG. 15 is a view showing an equivalent circuit of the transmission line according to the modified example of the second embodiment.

A transmission line 22A of the modified example is formed on a semiconductor substrate 21 such as a silicon substrate, and includes a capacitor section 23A, an inductor section 24A and an MSM junction 25A. When a desired signal RF is inputted to the left end in the drawing, the transmission line 22A transmits the signal RF from the left to the right, and outputs it from the right end. As shown in FIG. 15, an equivalent circuit of the transmission line 22A at this time is represented by a variable inductance VL and a capacitance C.

Figure 16:
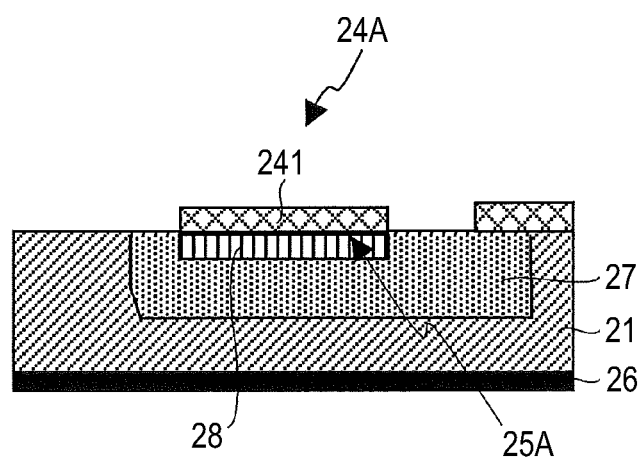
FIG. 16 is a sectional view showing a sectional structure along line d-d' of FIG. 12.

FIG. 16 shows a sectional structure along line d-d' of FIG. 14. An N or P region 27 is formed in a surface layer of the semiconductor substrate 21, so that a depletion layer 28 is formed just below a conductor 241 of the inductor section 24A. By this, the MS junction 25A is formed just below the formation portion of the inductor section 24A. When a voltage V4 is applied to the MS junction 25A, the inductance value of the inductor section 24A can be made variable by the voltage value of the voltage V4.

The two different transmission lines described above, that is, the left-handed transmission line 12 of the first embodiment and the right-handed transmission line 22 of the second embodiment are made base elements, and various types of circuits can be formed by combining these.

3. Third Embodiment

Figure 17:
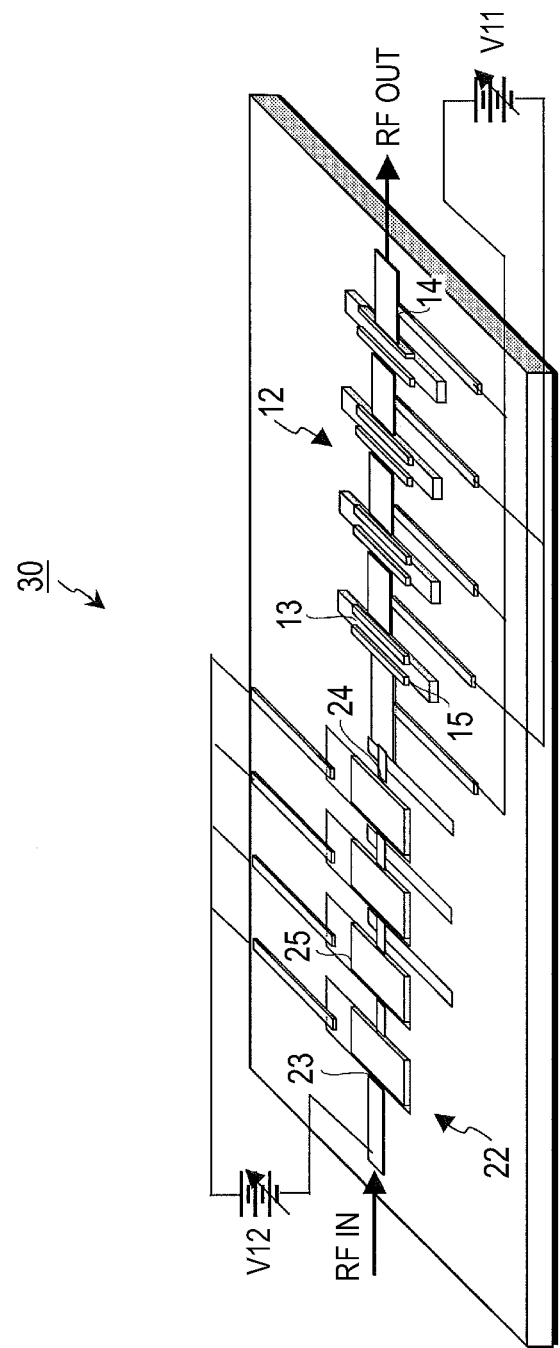
FIG. 17 is a perspective view showing the outline of a structure of a semiconductor device according to a third embodiment of the invention.

FIG. 17 is a perspective view showing the outline of a structure of a semiconductor device according to a third embodiment of the invention. In FIG. 17, the same portion as that of FIG. 1 and FIG. 9 is denoted by the same reference numeral, and its duplicate description is omitted.

A semiconductor device 30 of this embodiment has a structure in which the left-handed transmission line 12 of the first embodiment and the right-handed transmission line 22 of the second embodiment are connected in series to each other. The specific structures of the two transmission lines 12 and 22 are as described before.

That is, the left-handed transmission line 12 includes a capacitor section 13 and an inductor section 14, and an MSM junction 15 is formed in the capacitor section 23, so that the capacitance component is variable. The right-handed transmission line 22 includes a capacitor section 23 and an inductor section 24, and an MS section 25 is formed in the capacitor section 23, so that the capacitance component is variable.

A voltage V11 applied to the MSM junction 15 of the left-handed transmission line 12 and a voltage V12 applied to the MS section 25 of the right-handed transmission line 22 are changed in a reverse bias state, so that the width of the depletion layer of each of the MSM junction 15 and the MS section 25 can be controlled. As a result, the respective capacitance values of the left-handed transmission line 12 of the first embodiment and the right-handed transmission line 22 of the second embodiment can be made variable.

Figure 18:
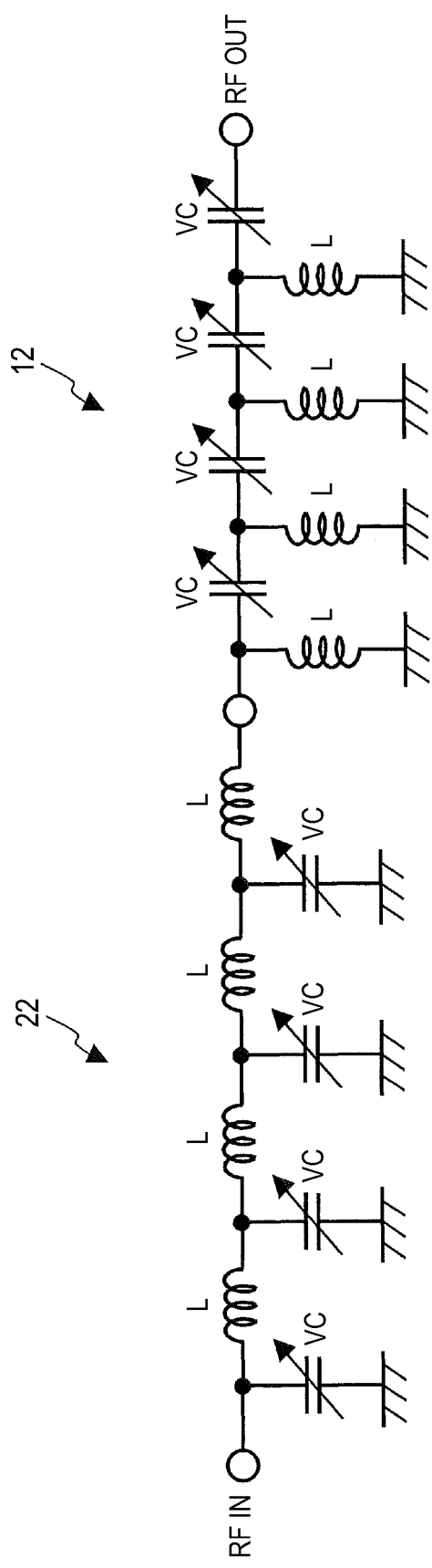
FIG. 18 is a view showing an equivalent circuit of the semiconductor device according to the third embodiment.

As shown in FIG. 18, an equivalent circuit of the semiconductor device 30 of the embodiment at this time is an equivalent circuit model in which the equivalent circuit of FIG. 2 is connected in series to the equivalent circuit of FIG. 10. By this, a band pass filter can be constructed. The band width of the band pass filter is variable according to each voltage value of the external voltages V11 and V12. That is, the cut-off frequency on the low frequency side can be controlled by changing the voltage value of the external voltage V11, and the cut-off frequency on the high frequency side can be controlled by changing the voltage value of the external voltage V12 respectively independently.

Figure 19:
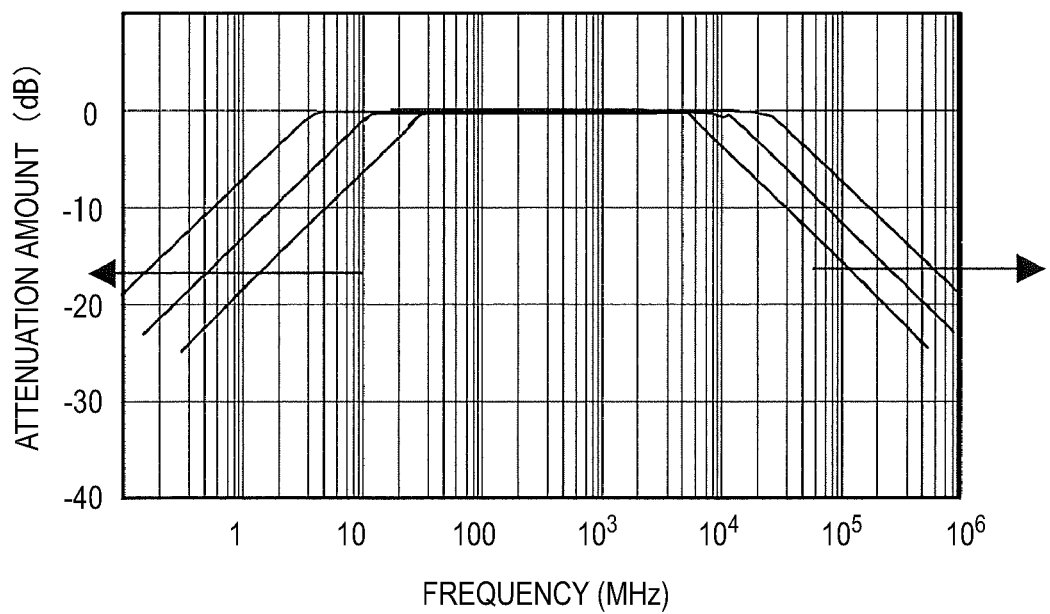
FIG. 19 is a view showing an example of a frequency characteristic of a band pass filter represented by the equivalent circuit of FIG. 18.

FIG. 19 shows an example of frequency characteristic of the band pass filter represented by the equivalent circuit of FIG. 18. The cut-off frequency on the low frequency side and the cut-off frequency on the high frequency side can be respectively independently changed by the external voltage V11 and the external voltage V12. Besides, in the frequency characteristic of FIG. 19, the attenuation characteristics on the low frequency side and the high frequency side can be changed by the structure of the number of stages of the capacitor sections 13 and 23 and the inductor sections 14 and 24 incorporated in the transmission lines 12 and 22.

Incidentally, as is easily estimated from the modified examples of the first embodiment and the second embodiment, as described in these modified examples, also when the inductance component is made variable, the band pass filter similar to the band pass filter of this embodiment can be formed.

At this time, similarly to FIG. 17, a voltage is independently applied from the outside to the MS junction provided in the inductor formation portion of each of the transmission lines 12 and 22. The band pass filter can be easily constructed in which the cut-off frequencies on the low frequency side and the high frequency side can be independently controlled.

4. Fourth Embodiment

Figure 20:
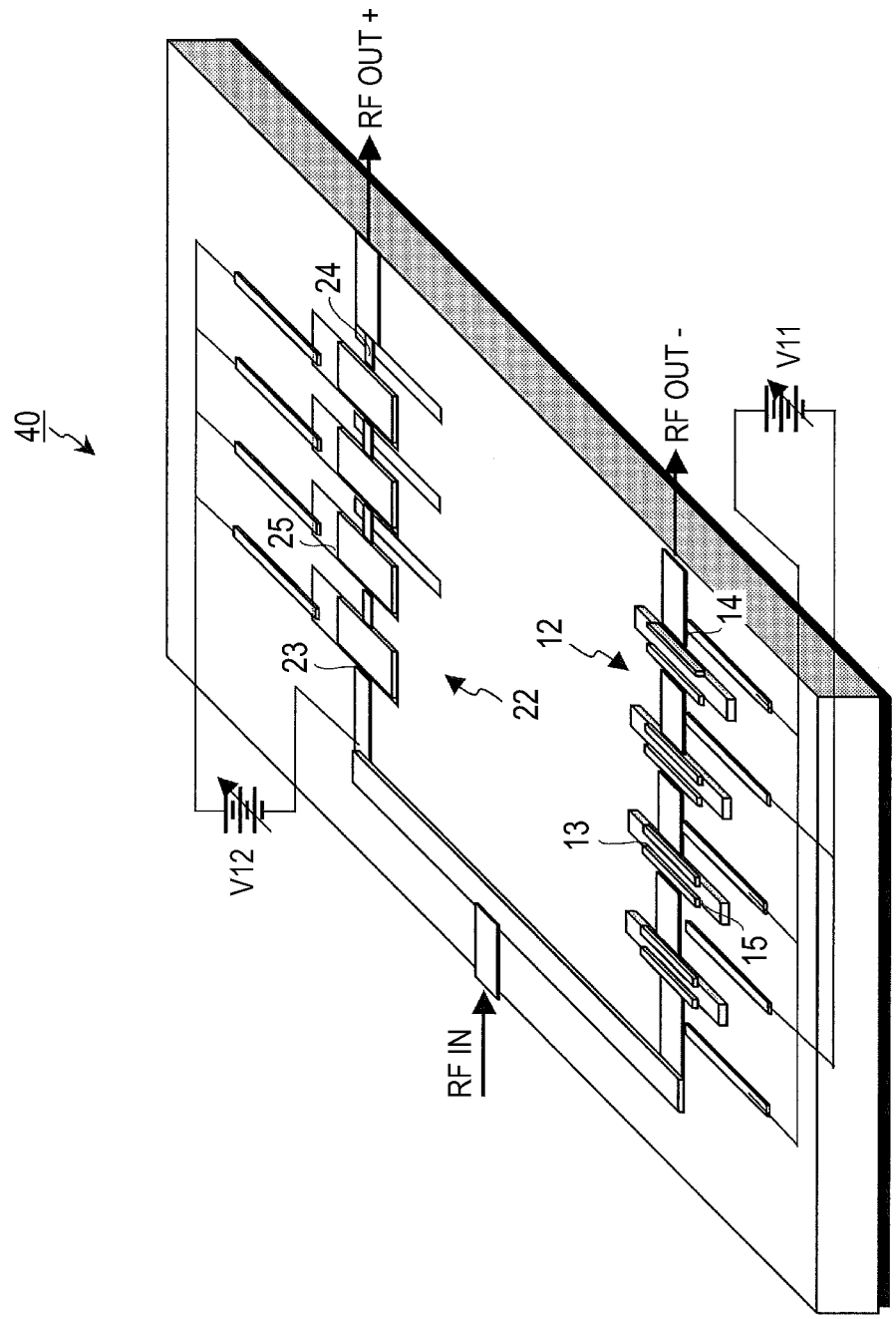
FIG. 20 is a perspective view showing the outline of a structure of a semiconductor device according to a fourth embodiment of the invention.

FIG. 20 is a perspective view showing the outline of a structure of a semiconductor device according to a fourth embodiment of the invention. In FIG. 20, the same portion as that of FIG. 1 and FIG. 9 is denoted by the same reference numeral and its duplicate description is omitted.

A semiconductor device 40 of this embodiment has a structure in which the left-handed transmission line 12 of the first embodiment and the right-handed transmission line 22 of the second embodiment are connected so that the input terminal is common. By this connection relation, a balun (balanced to unbalanced transformer) can be constructed. The specific structure of each of the two transmission lines 12 and 22 is as described above.

That is, the left handed transmission line 12 includes a capacitor section 13 and an inductor section 14, and an MSM junction 15 is formed in the capacitor section 13, so that the capacitance component can be changed. The right-handed transmission line 22 includes a capacitor section 23 and an inductor section 24, and an MS section 25 is formed in the capacitor section 23, so that the capacitance component can be changed.

A voltage V11 applied to the MSM junction 15 of the left-handed transmission line 12 and a voltage V12 applied to the MS section 25 of the right-handed transmission line 22 are changed in the reverse bias state, so that the width of each depletion layer of the MSM junction 15 and the MS section 25 can be controlled. As a result, the capacitance value of each of the left-handed transmission line 12 and the right-handed transmission line 22 can be made variable.

Figure 21:
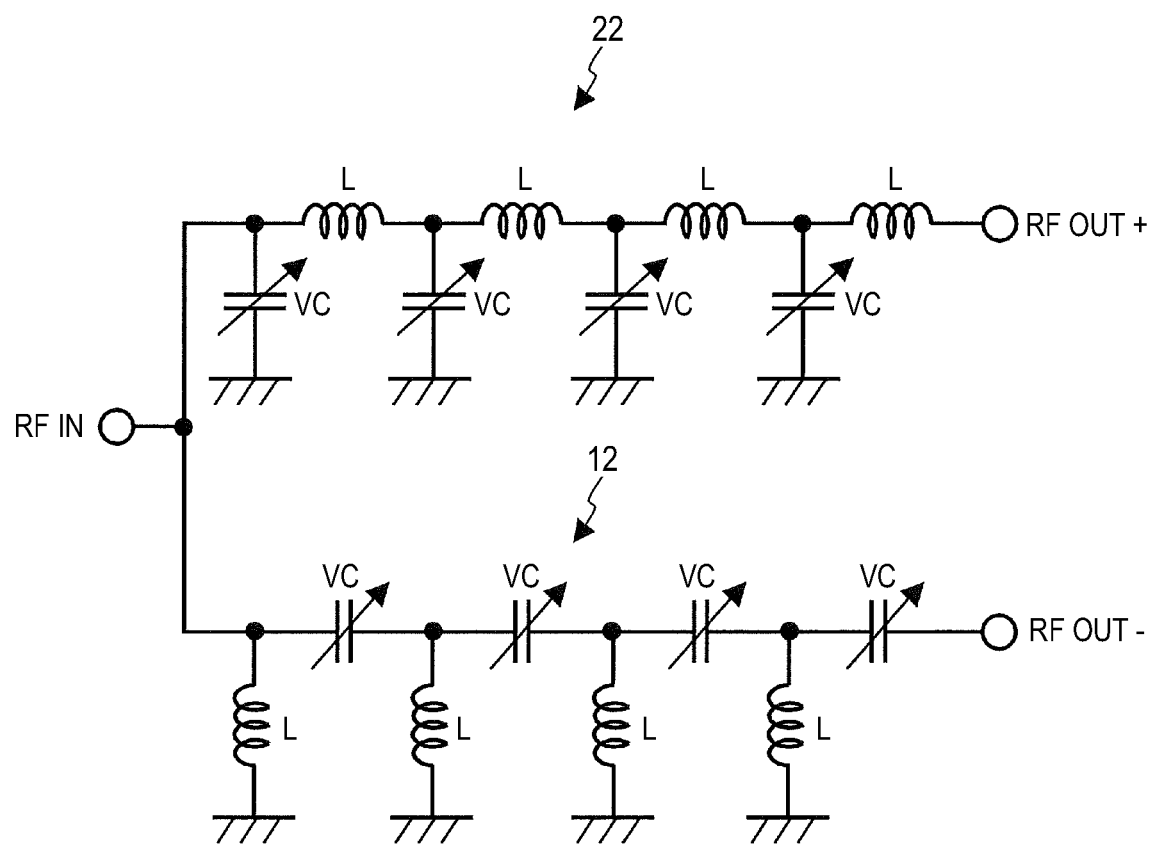
FIG. 21 is a view showing an equivalent circuit of the semiconductor device according to the fourth embodiment.

In the semiconductor device 40 of the balun structure, a signal RFin inputted to the input end common to the two transmission lines 12 and 22 is divided into two, and is outputted as signals RFout− and RFout+, whose phases are different from each other by 180 degrees, from the left-handed transmission line 12 and the right-handed transmission line 22. FIG. 21 shows an equivalent circuit at this time. Similarly to the case of the band pass filter, the band width of the balun is variable according to the voltage value of each of the external voltages V11 and V12. As a result, the balun can be made to operate in a very wide band.

5. Operation and Effect of the First to the Fourth Embodiments

As described in the first to the fourth embodiments, by using the property of the semiconductor junction and by forming the two kinds of the transmission lines 12 and 22 electrically connected to the junction on the semiconductor substrate, the transmission lines 12 and 22 whose transmission characteristics are variable can be directly formed on the semiconductor substrate in the simple structures. In various functional elements of these structures, specifically in the high frequency element (circuit), the characteristic can be controlled on the frequency axis by controlling the external voltage. This means that functional elements of all bands can be dealt with, and there is a great merit that various applications can be dealt with.

That these functional elements can be directly formed on the semiconductor substrate means that integration with all types of active elements can be performed simultaneously. As compared with a case where a chip component or the like is formed through a package or the like, the influence of an electrical parasitic component can be avoided. As a result, the characteristic of the functional element can be improved. Further, it is also advantageous in compactness, productivity and cost that the functional element can be formed on the same semiconductor substrate as an active element (circuit).

Besides, the characteristics of these functional elements can be changed from the outside by changing the widths of the depletion layers formed in the capacitor sections 12 and 22 and the inductor sections 13 and 23 by the external voltages. Further, since the property of the semiconductor junction is used in the reverse bias state, the power consumption is very low. Further, as compared with the related art functional element constructed of only the right handed transmission line, the functional element of the combination of the left handed transmission line and the right handed transmission line is superior in broadband property, low loss property and the like.

As is apparent from the above, according to the first to the fourth embodiments, in characteristics, power consumption and shape factor, as compared with the related art case where liquid crystal or ferroelectric substance is used, the extremely superior functional element, specifically, the high frequency element (circuit) can be formed on the semiconductor substrate.

6. Modified Example

In the first to the fourth embodiments, although the case where the silicon substrate is used as the semiconductor substrate is used as the example, no limitation is made to the silicon substrate. It is easily understood that any material such as, for example, a semiconductor in which an insulating property is obtained, a IV group semiconductor such as Ge, a III-V group semiconductor such as GaAs or InP, a II-IV group such as ZnS or ZnSe, a ternary compound of these, a quarternary compound or the like may be used.

Also with respect to the metal of the conductor used as the transmission lines 12 and 22, it is needless to say that any material, such as Al, Cu, Ag, Pt and Au, may be used as long as the MS junction can be formed in the junction with the semiconductor.

7. Application Example

The semiconductor devices of the first to the fourth embodiments, that is, the functional elements such as the high pass filter, the low pass filter, the band pass filter, and the balun can be used for a communication apparatus, especially a communication apparatus for high-speed transmission of 30 GHz or higher.

The present application contains subject matter related to that disclosed in Japanese Priority Patent Application JP 2009-208797 filed in the Japan Patent Office on Sep. 10, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising a transmission line, the transmission line including (a) a capacitor section and an inductor section arranged on a semiconductor substrate and (b) a junction of the semiconductor substrate and one of the capacitor section and the inductance section, a transmission characteristic of the transmission line determined by a voltage applied to the junction.

2. The semiconductor device according to claim 1, wherein the transmission line is a left-handed transmission line.

3. The semiconductor device according to claim 2, wherein the transmission line constitutes a high pass filter, and a cut-off frequency of the high pass filter is variable according to the voltage.

4. The semiconductor device according to claim 1, wherein the transmission line is a right-handed transmission line.

5. The semiconductor device according to claim 4, wherein the transmission line constitutes a low pass filter, and a cut-off frequency of the low pass filter is variable according to the voltage.

6. The semiconductor device according to claim 1, wherein the transmission line includes a left-handed transmission line and a right-handed transmission line which are connected in series to each other.

7. The semiconductor device according to claim 6, wherein the transmission line constitutes a band pass filter, and a cut-off frequency of the band pass filter is variable according to the voltage.

8. The semiconductor device according to claim 1, wherein the transmission line includes a left-handed transmission line and a right-handed transmission line in which input ends are connected in common.

9. The semiconductor device according to claim 8, wherein the transmission line constitutes a balun, and a band width of the balun is variable according to the voltage.

10. A communication apparatus using a semiconductor device comprising a transmission line, the transmission line including (a) a capacitor section and an inductor section arranged on a semiconductor substrate and (b) a junction of the semiconductor substrate and one of the capacitor section and the inductance section, a transmission characteristic of the transmission line determined by a voltage applied to the junction.

* * * * *